(12) United States Patent
Peterson et al.

(10) Patent No.: US 7,863,097 B2
(45) Date of Patent: Jan. 4, 2011

(54) METHOD OF PREPARING DETECTORS FOR OXIDE BONDING TO READOUT INTEGRATED CHIPS

(75) Inventors: Jeffrey M. Peterson, Santa Barbara, CA (US); Kenton T. Veeder, Burlington, MA (US); Christopher L. Fletcher, Santa Barbara, CA (US)

(73) Assignee: Raytheon Company, Waltham, MA (US)

( * ) Notice: Subject to any disclaimer, the term of this patent is extended or adjusted under 35 U.S.C. 154(b) by 250 days.

(21) Appl. No.: 12/267,270

(22) Filed: Nov. 7, 2008

(65) Prior Publication Data

US 2010/0117227 A1    May 13, 2010

(51) Int. Cl.
*H01L 21/00* (2006.01)
(52) U.S. Cl. .................. 438/108; 257/777; 257/778; 257/E27.137; 257/E21.511
(58) Field of Classification Search ......... 438/106–108, 438/118, 119; 257/777, 778, E27.144, E27.137, 257/E27.161, E21.511
See application file for complete search history.

(56) References Cited

U.S. PATENT DOCUMENTS

| | | | |
|---|---|---|---|
| 5,272,095 A | 12/1993 | Enquist et al. | |
| 5,318,916 A | 6/1994 | Enquist et al. | |
| 6,242,794 B1 | 6/2001 | Enquist | |
| 6,355,542 B1* | 3/2002 | Andoh | 438/460 |
| 6,368,930 B1 | 4/2002 | Enquist | |
| 6,500,694 B1 | 12/2002 | Enquist | |
| 6,563,133 B1 | 5/2003 | Tong | |
| 6,803,557 B1 | 10/2004 | Taylor et al. | |
| 6,822,326 B2 | 11/2004 | Enquist et al. | |
| 6,867,073 B1 | 3/2005 | Enquist | |
| 6,902,987 B1 | 6/2005 | Tong et al. | |
| 6,962,835 B2 | 11/2005 | Tong et al. | |
| 6,984,571 B1 | 1/2006 | Enquist | |
| 2004/0157407 A1 | 8/2004 | Tong et al. | |
| 2004/0235266 A1 | 11/2004 | Tong | |
| 2005/0081905 A1* | 4/2005 | Lan et al. | 136/224 |
| 2005/0194668 A1 | 9/2005 | Enquist et al. | |
| 2006/0264004 A1 | 11/2006 | Tong et al. | |
| 2007/0037379 A1 | 2/2007 | Enquist et al. | |

OTHER PUBLICATIONS

Tong, Q-Y., "Wafer Bonding for integrated materials", Materials Science and engineering B, vol. 87, No. 3, pp. 323-328 (2001).
International Search Report dated Feb. 19, 2010 of PCT/US09/63550 filed Nov. 6, 2009 (11 pages).

* cited by examiner

*Primary Examiner*—Brook Kebede
(74) *Attorney, Agent, or Firm*—Pillsbury Winthrop Shaw Pittman LLP

(57) ABSTRACT

In one embodiment, a method of preparing detectors for oxide bonding to an integrated chip, e.g., a readout integrated chip, includes providing a wafer having a plurality of detector elements with bumps thereon. A floating oxide layer is formed surrounding each of the bumps at a top portion thereof. An oxide-to-oxide bond is formed between the floating oxide layer and an oxide layer of the integrated chip which is provided in between corresponding bumps of the integrated chip. The oxide-to-oxide bond enables the bumps on the detector elements and the bumps on the integrated chip to be intimately contacted with each other, and removes essentially all mechanical stresses on and between the bumps. In another embodiment, a device has an interconnect interface that includes the oxide-to-oxide bond and an electrical connection between the bumps on the detector elements and the bumps on the integrated chip.

26 Claims, 9 Drawing Sheets

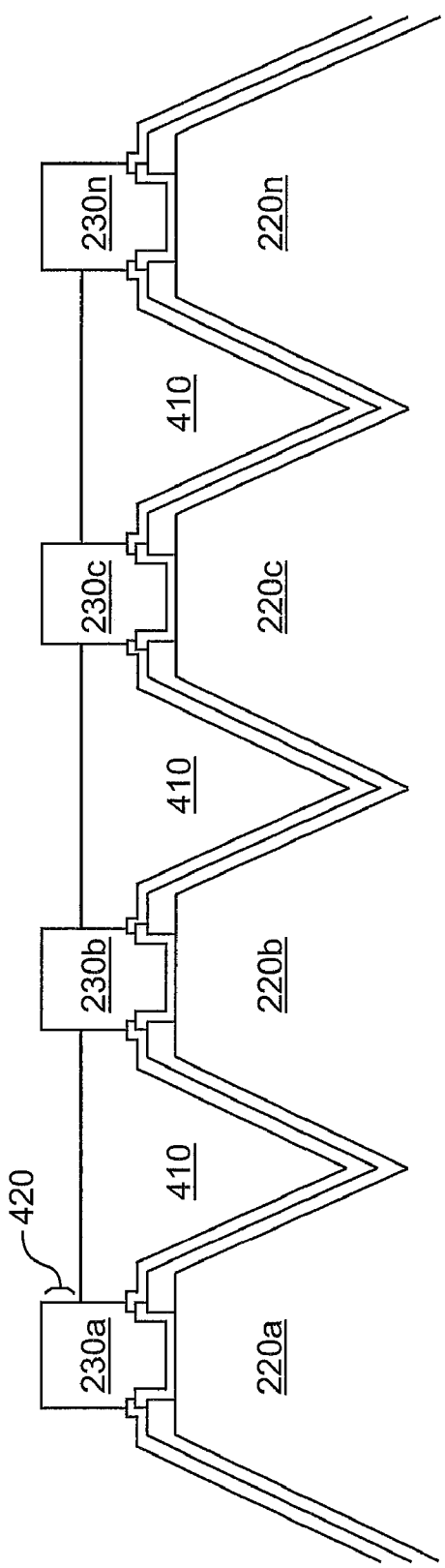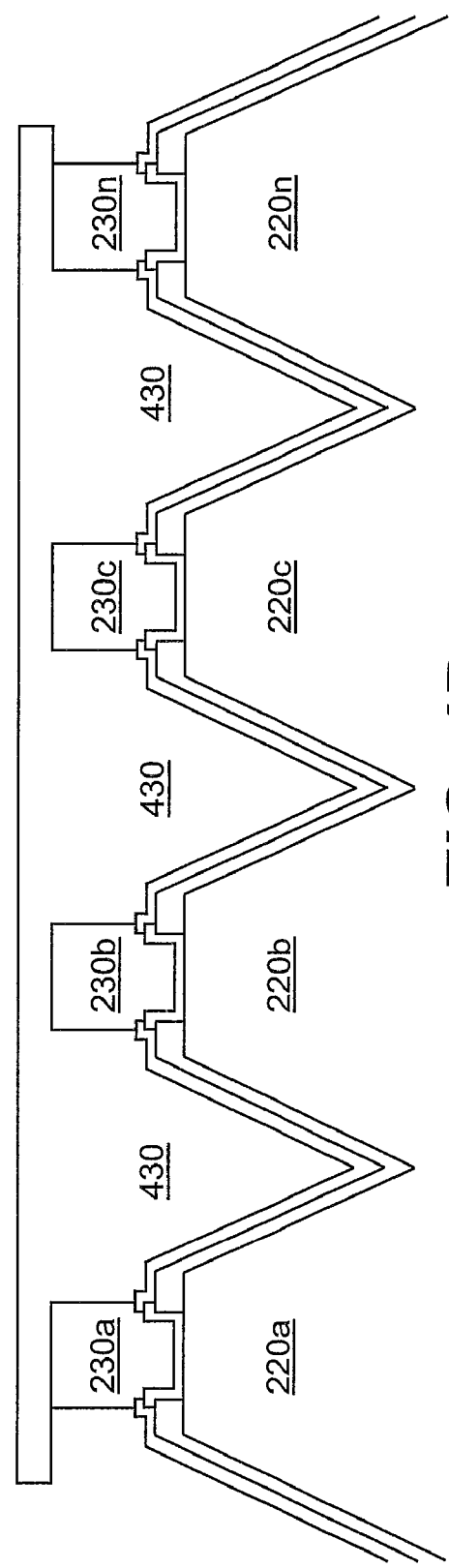

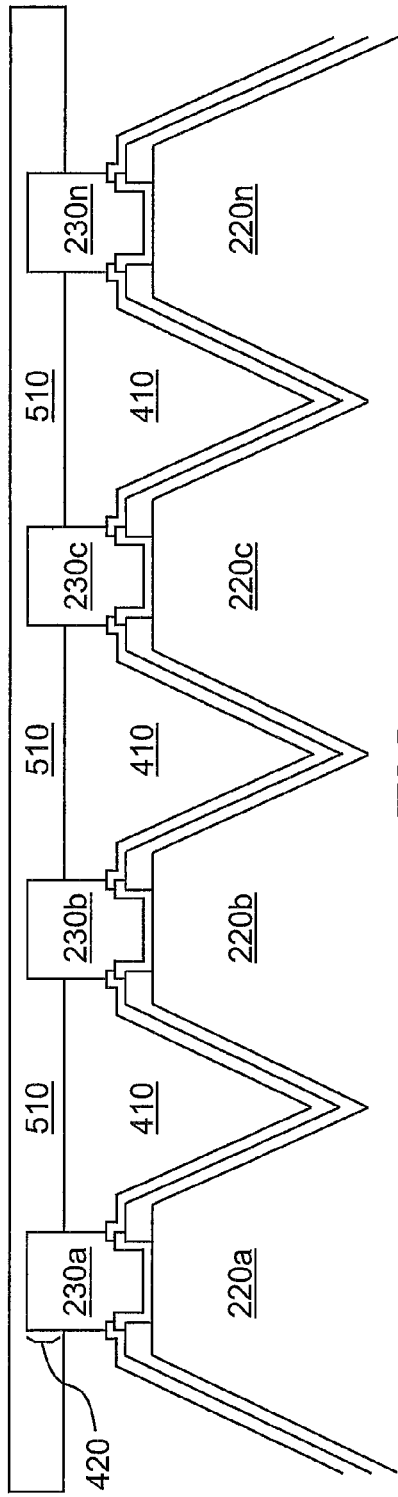
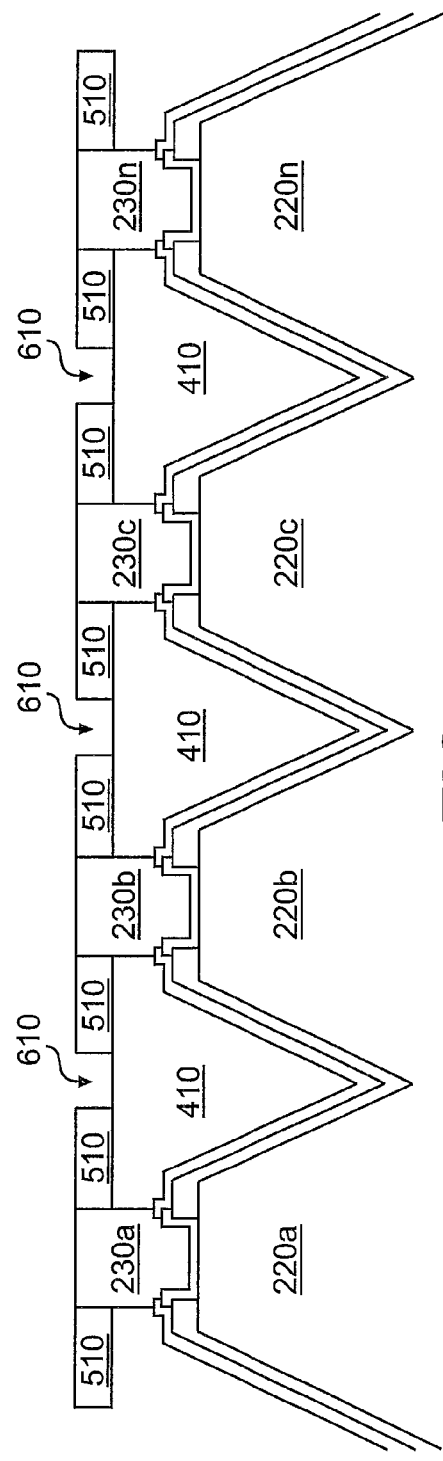

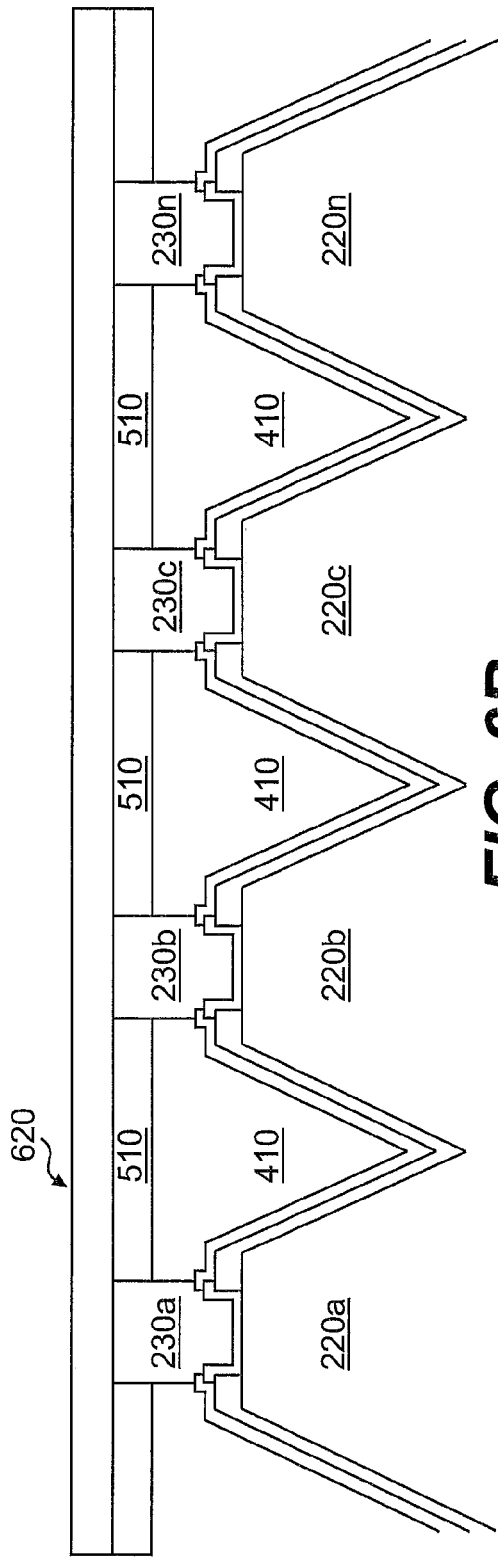
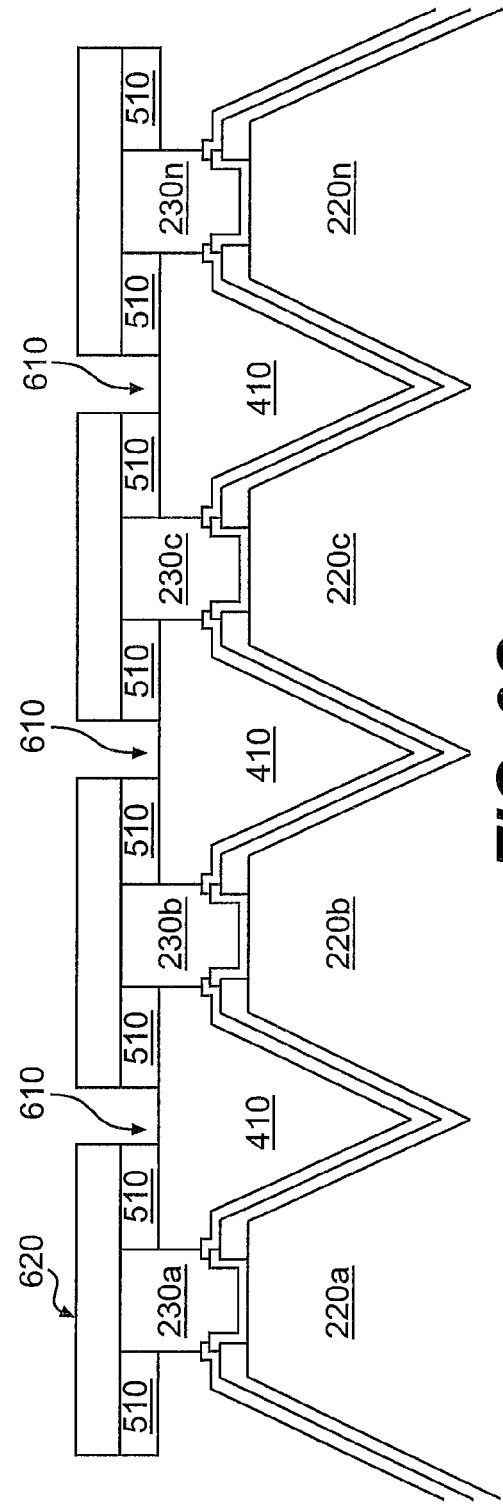

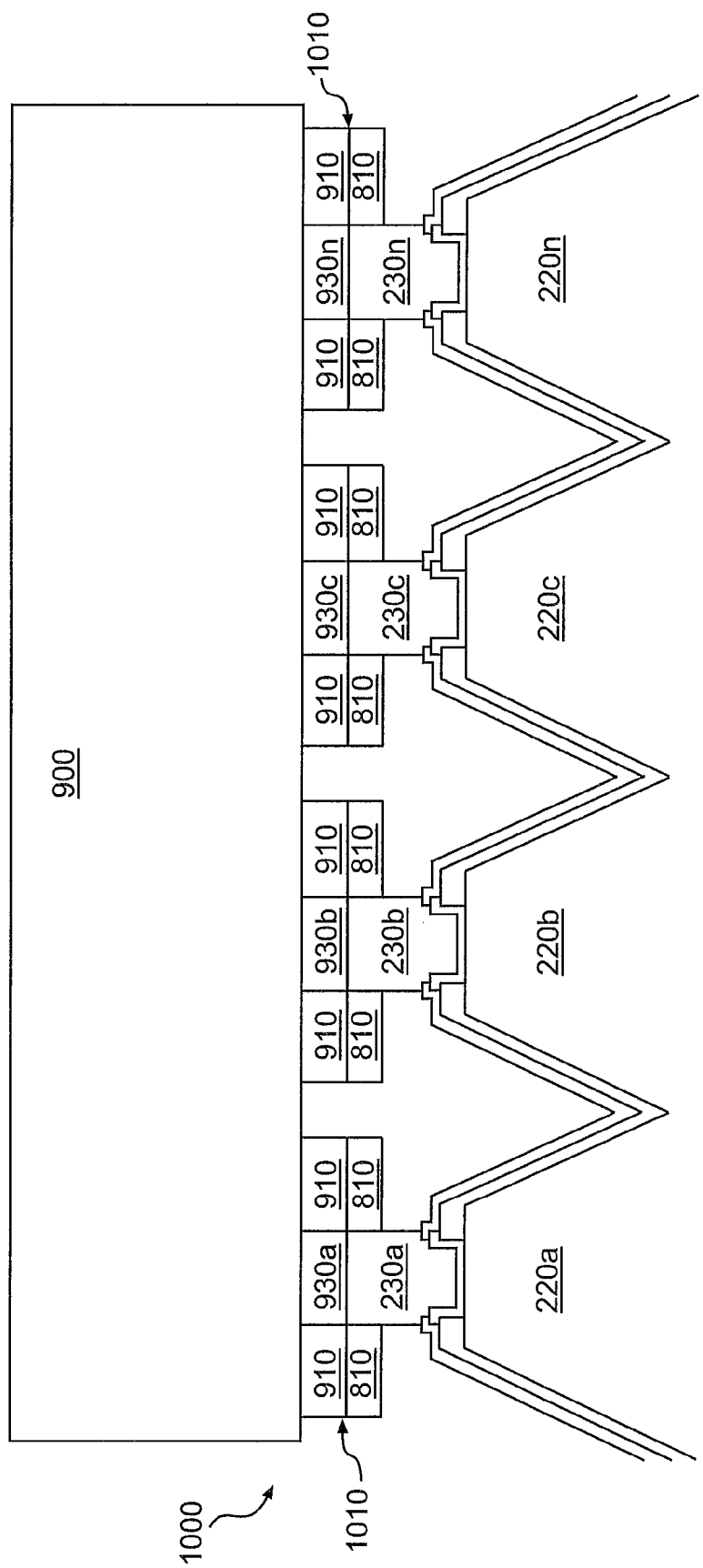

US 7,863,097 B2

METHOD OF PREPARING DETECTORS FOR OXIDE BONDING TO READOUT INTEGRATED CHIPS

BACKGROUND

The present disclosure relates to a method of preparing detectors with bumps thereon for oxide bonding to integrated chips, and a device utilizing oxide-bonded bumps.

Conventionally, an indium-to-indium cold-welding process is utilized to bond detectors, for example, HgCdTe detectors to readout integrated chips. The indium-to-indium cold-welding process requires application of high external pressure and force to form the bond. Indium, being a weak material, is subject to breakage on application of such high external pressure/force. In addition, the indium-to-indium cold-welding process may also cause mechanical damage to the detectors due to the application of the high external pressure/force.

These and other drawbacks to conventional approaches exist.

SUMMARY

The present disclosure address these and other drawbacks in conventional approaches relating to a method of preparing detectors with bumps thereon for oxide bonding to integrated chips.

In one embodiment, a method includes providing a wafer having a plurality of detector elements with bumps thereon; forming a layer of polymer between each of the bumps; depositing an oxide layer on a top portion of each of the bumps and the polymer layer; forming a plurality of vias in the oxide layer between adjacent bumps; and removing the polymer layer such that a remaining oxide layer forms a floating oxide layer, the floating oxide layer surrounding each of the bumps at the top portion thereof.

In one embodiment, a microelectronic device is fabricated. The microelectronic device includes a detector array having a plurality of detector elements with bumps thereon, each of the bumps having a floating oxide layer surrounding the bumps at a top portion thereof; an integrated chip having corresponding bumps thereon and an oxide layer in between the bumps; and an interconnect interface between the corresponding bumps on the integrated chip and the bumps on the detector elements. The interconnect interface includes an oxide-to-oxide bond between the floating oxide layer and the oxide layer of the integrated chip, the oxide-to-oxide bond providing a structural bond between the detector elements and the integrated chip and removing essentially all mechanical stresses on and between the bumps on the integrated chip and the bumps on the detector elements; and an electrical connection between each of the corresponding bumps on the integrated chip and the bumps on the detector elements.

Various other features and aspects of this disclosure will be apparent through the detailed description of various embodiments and the drawings attached hereto. It is also to be understood that both the foregoing general description and the following detailed description are exemplary and not restrictive of the scope of the inventive concept.

BRIEF DESCRIPTION OF THE DRAWINGS

FIG. 4A is a schematic depiction of the detector device having a layer of polymer formed between each of the bumps, wherein at least a top portion of each of the bumps is exposed, in accordance with an embodiment;

FIG. 4B is a schematic depiction of the detector device having a polymer layer formed on and in between each of the bumps, in accordance with an embodiment;

FIG. 5 is a schematic depiction of the detector device having an oxide layer formed on the top portion of each of the bumps and the polymer layer formed in between each of the bumps, in accordance with an embodiment;

FIG. 6A is a schematic depiction of the detector device having a plurality of vias formed in the oxide layer between adjacent bumps, in accordance with an embodiment;

FIG. 6B is a schematic depiction of the detector device having a photoresist layer applied on the oxide layer, in accordance with an embodiment;

FIG. 6C is a schematic depiction of the detector device with the oxide layer etched through the photoresist layer to form vias in the oxide layer between adjacent bumps, in accordance with an embodiment;

FIG. 10 is a schematic depiction of a microelectronic device fabricated by the bonding of the detector elements and the integrated chip, in accordance with an embodiment.

DETAILED DESCRIPTION

Figure 1:
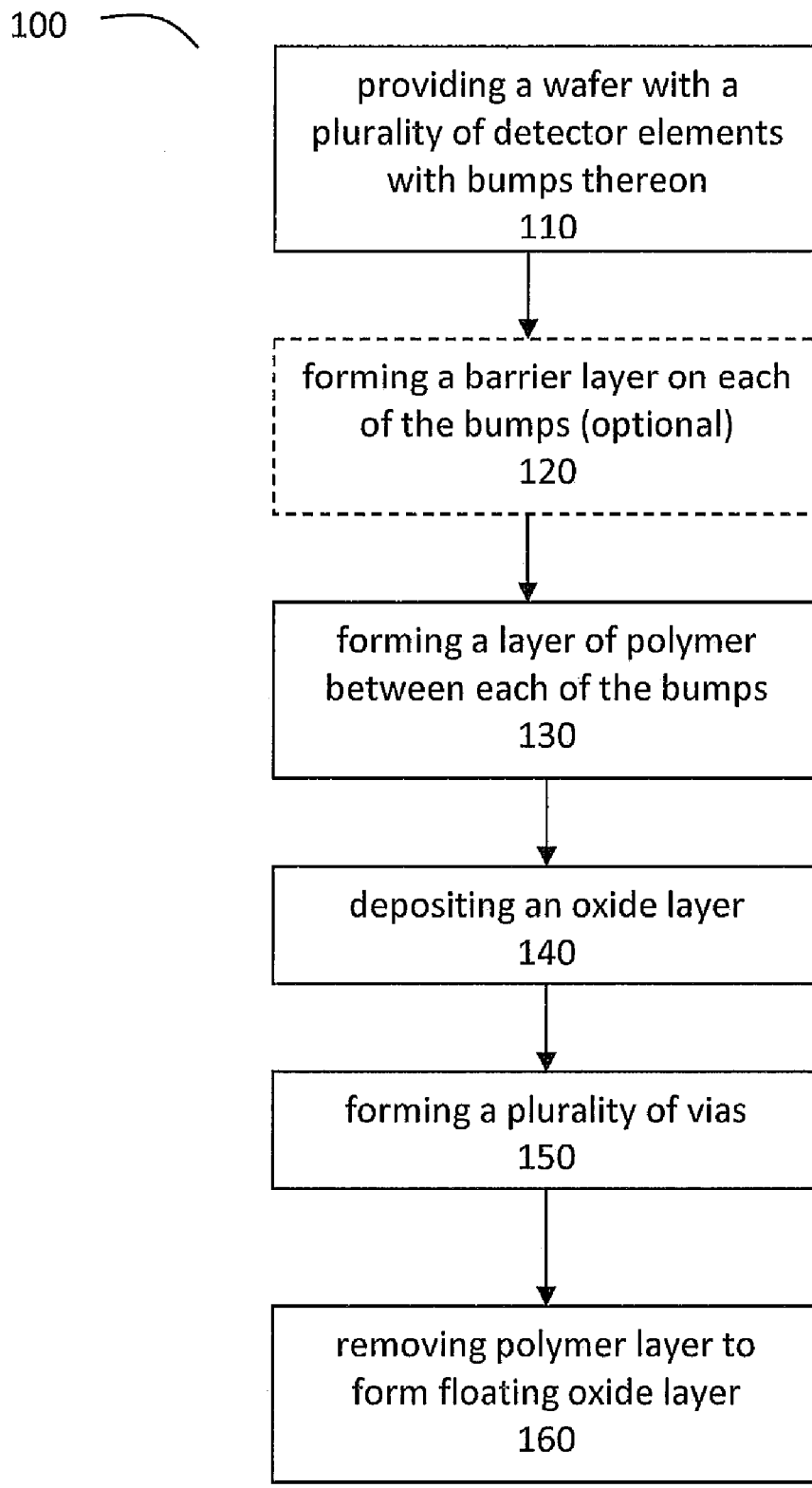
FIG. 1 is an exemplary illustration of a method of preparing detectors for oxide bonding, according to an embodiment.
Figure 2:
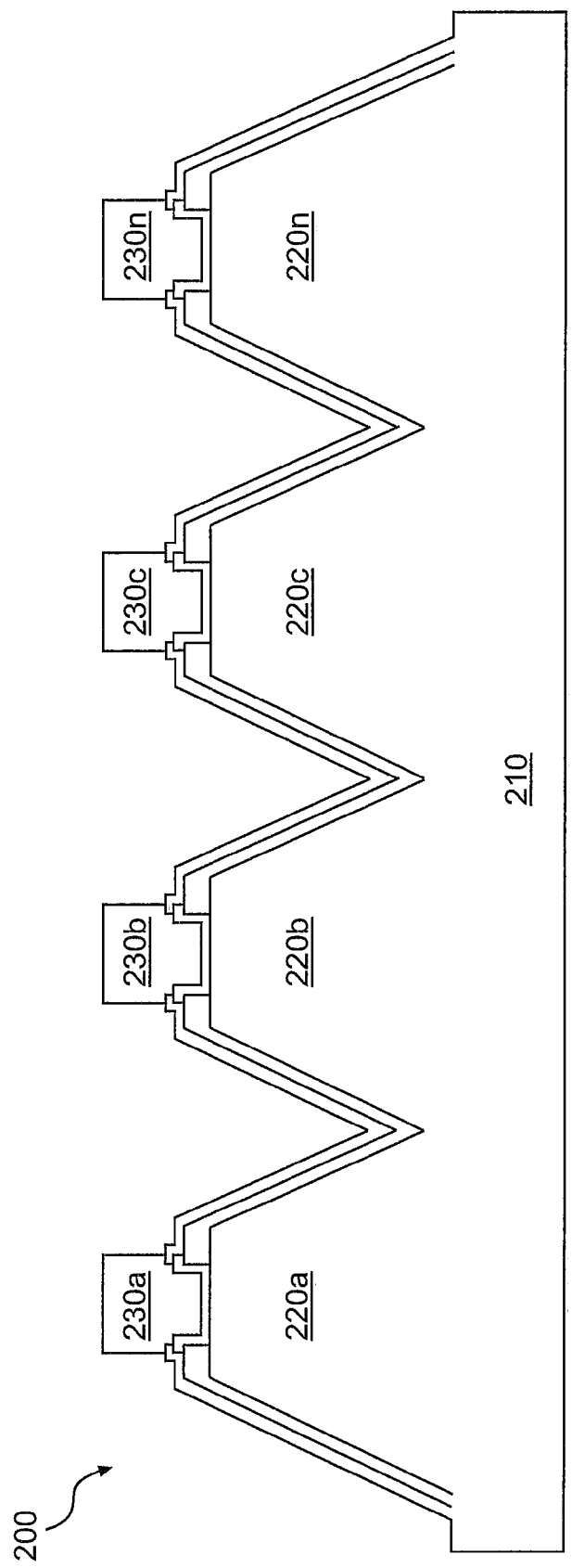
FIG. 2 is a schematic depiction of a detector device having a plurality of detector elements with bumps thereon, in accordance with an embodiment.

FIG. 1 is an exemplary flowchart of operations performed for preparing detector elements with bumps thereon for oxide bonding. In operation 110, a wafer having a plurality of detector elements with bumps thereon is provided. In one embodiment, as shown in aspects of a method illustrated in FIGS. 2-10, a detector device 200 comprises wafer 210 having a plurality of detector elements 220a, 220b, 220c, ..., 220n with bumps 230a, 230b, 230c, ..., 230n thereon. In one embodiment, detector device 200 may be an infrared detector device used in thermal imaging applications. In one embodiment, detector elements 220a, ..., 220n may be photodiodes or photoconductors that detect infrared radiation or radiation in another wavelength band of interest. In one embodiment, detector elements 220a, ..., 220n form a detector array, for example, a focal plane array, or other type of detector array. In one embodiment, detector elements 220a, ..., 220n may be fabricated from HgCdTe or InSb semiconductor material that is capable of detecting radiation at various wavelengths, e.g., at infrared wavelengths. Other kinds of semiconductor materials may be used to fabricate the detector elements. In one embodiment, bumps 230a, ..., 230n are indium bumps.

Figure 3:
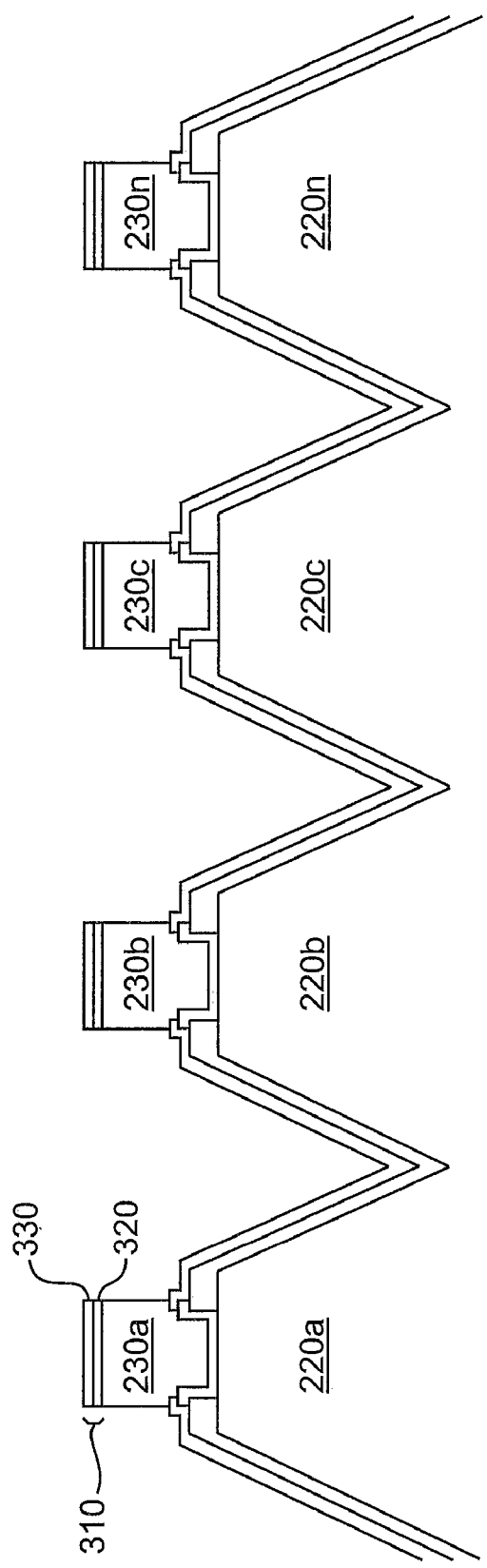
FIG. 3 is a schematic depiction of the detector device with a barrier layer deposited on each of the bumps, in accordance with an embodiment.

Referring back to FIG. 1, optionally, a barrier layer may be formed on each of the bumps in operation 120. In one embodiment, as shown in FIG. 3, barrier layer 310 may be formed on each of bumps 230a, 230b, ..., 230n. In one embodiment, barrier layer 310 may comprise a plurality layers, for example, first layer 320, second layer 330, and/or other layers. In one embodiment, first layer 320 is a diffusion barrier layer that may serve as a diffusion barrier between bumps 230a, 230b, ..., 230n, and second layer 330. In one embodiment, first layer 320 may be a metal nitride layer. In one embodiment, second layer 330 may be a metal contact layer comprising Ziptronix® metal. In one embodiment, first layer 320 may prevent Ziptronix® metal from second layer 330 from diffusing into indium bumps 230a, 230b, ..., 230n. In one embodiment, barrier layer 310 may be formed by first depositing first layer 320 onto bumps 230a, 230b, ..., 230n, and then depositing second layer 330 onto first layer 320. In one embodiment, deposition of second layer on first layer 320 may be performed at a temperature of less than or equal to 100° C. Elevated temperatures could result in damage to certain sensitive components resulting, at least in part, from the semiconductor material that is used to fabricate the detector elements. For example, a temperature of 170° C. might be acceptable for a short period of time; however, a temperature of more than 100° C. for an extended period of time may not be acceptable depending on the particular semiconductor materials used.

Referring back to FIG. 1, in operation 130, a layer of polymer may be formed between each of the bumps 230a, 230b, ..., 230n. In one embodiment, as shown in FIG. 4A, a layer of polymer 410 may be formed between bumps 230a, 230b, ..., 230n, wherein at least a top portion 420 of each of the bumps is exposed. In one embodiment, polymer layer 410 may be formed by performing the following operations: forming a layer of polymer 430 on and in between each of the bumps 230a, 230b, ..., 230n (as shown in FIG. 4B, for example); and then, thinning down polymer layer 430 such that polymer layer 410 is formed in between the bumps 230a, 230b, ..., 230n, and such that at least a top portion 420 of each of the bumps 230a, 230b, ..., 230n is exposed. In one embodiment, the thinning down of polymer layer 430 may be performed by a process that uses de-ionized water. In one embodiment, the thinning down of polymer layer 430 may be performed by an etching process that uses a mixture of de-ionized water and isopropyl alcohol. In one embodiment, polymer layer 410/430 may be a soluble polymer layer. In another embodiment, polymer layer 410/430 may be a water soluble polymer layer. In one embodiment, polymer layer 410/430 may be polyethylene glycol, for example, PEG-10000. In one embodiment, polymer layer 430 may be formed by warming the polymer to a temperature of about 60-100° C. to improve flow characteristics, and then dispensing the polymer on a spinner device as conventionally used for application of photoresist. In one embodiment, polymer layer 430 may be formed by adding a solvent to the polymer to improve flow characteristics, and then removing the solvent by baking.

Referring back to FIG. 1, in operation 140, an oxide layer may be deposited on a top portion of each of the bumps and the polymer layer. In one embodiment, as shown in FIG. 5, oxide layer 510 may be deposited on top portion 420 of each of the bumps 230a, 230b, ..., 230n and polymer layer 410. In one embodiment, oxide layer 510 may be deposited by a sputtering process. In one embodiment, oxide layer 510 may be deposited by a chemical vapor deposition process. In one embodiment, deposition of oxide layer 510 may be performed at a temperature less than the melting point of the polymer used, in order to avoid undesirable non-uniformities.

Figure 7:
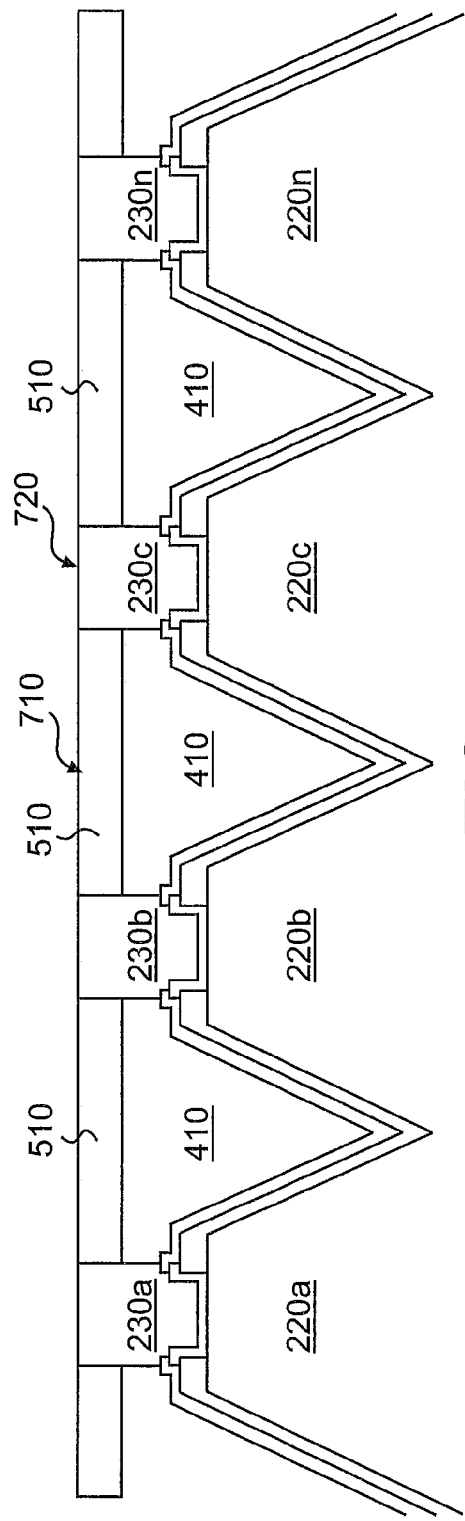
FIG. 7 is a schematic depiction of the detector device with the oxide layer planarized, in accordance with an embodiment.

Referring back to FIG. 1, in operation 150, a plurality of vias may be formed in the oxide layer between adjacent bumps. In one embodiment, as shown in FIG. 6A, vias 610 may be formed in oxide layer 510 in between adjacent bumps 230a, 230b, ..., 230n. In one embodiment, vias 610 may be formed by performing the following operations: applying a photoresist layer 620 on oxide layer 510 (as shown in, for example, FIG. 6B); patterning the photoresist layer 620 for the formation of vias between the adjacent bumps 230a, 230b, ..., 230n (not shown); etching oxide layer 510 through the photoresist later 620 to form vias 610 in oxide layer 510 between adjacent bumps 230a, 230b, ..., 230n (as shown in, for example, FIG. 6C); and removing the photoresist layer 620 to expose vias 610 (as shown in, for example, FIG. 6A). In one embodiment, before the formation of vias in the oxide layer 510, the oxide layer may be planarized such that a top surface thereof 710 is aligned with a top surface 720 of each of the bumps 230a, 230b, ..., 230n (as shown in FIG. 7, for example). In one embodiment, the photoresist layer 620 may be applied by dispensing the photoresist onto a spinning wafer using conventional semiconductor processing equipment. In one embodiment, hydrofluoric acid may be used to etch the oxide layer 510. In one embodiment, the oxide layer 510 may be dry etched in a plasma system.

Figure 8:
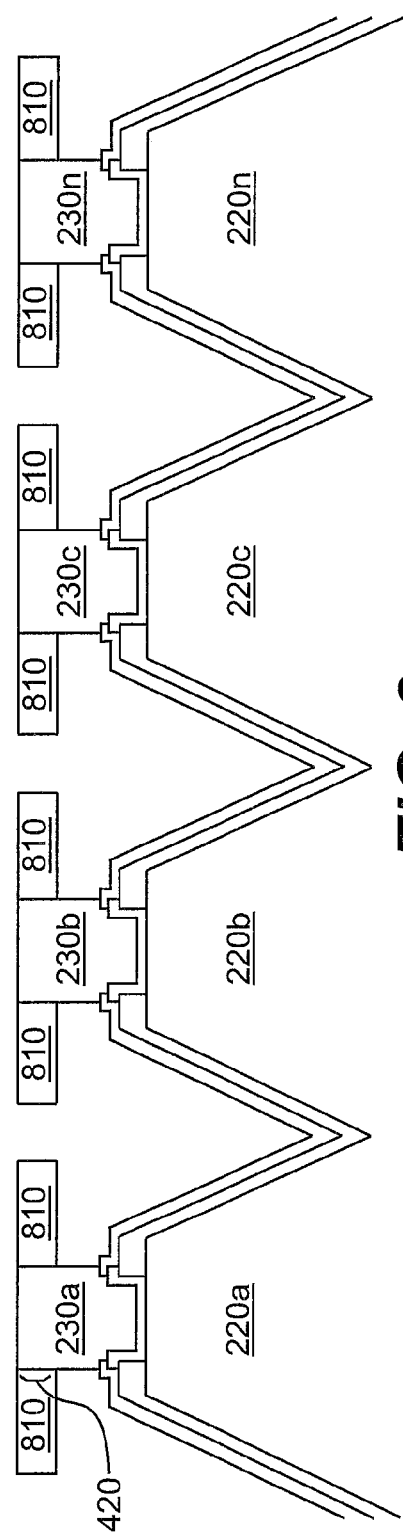
FIG. 8 is a schematic depiction of the detector device with a floating oxide layer formed surrounding each of the bumps at the top portion thereof, in accordance with an embodiment.

Referring back to FIG. 1, in operation 160, the polymer layer is removed such that the remaining oxide layer (for example, oxide layer remaining after the formation of vias in the oxide layer) forms a floating oxide layer surrounding each of the bumps at the top portion thereof. In one embodiment, as shown in FIG. 8, polymer layer 410 may be removed such that the remaining oxide layer forms a floating oxide layer 810 surrounding each of the bumps 230a, 230b, ..., 230n at the top portion 420 thereof. The floating oxide layer 810 floats above the detector elements 220a, 220b, ..., 220n and does not contact the surfaces of the detector elements 220a, 220b, ..., 220n or surfaces of wafer 210. In one embodiment, the polymer layer 410 may be removed by performing a de-ionization rinse.

Figure 9:
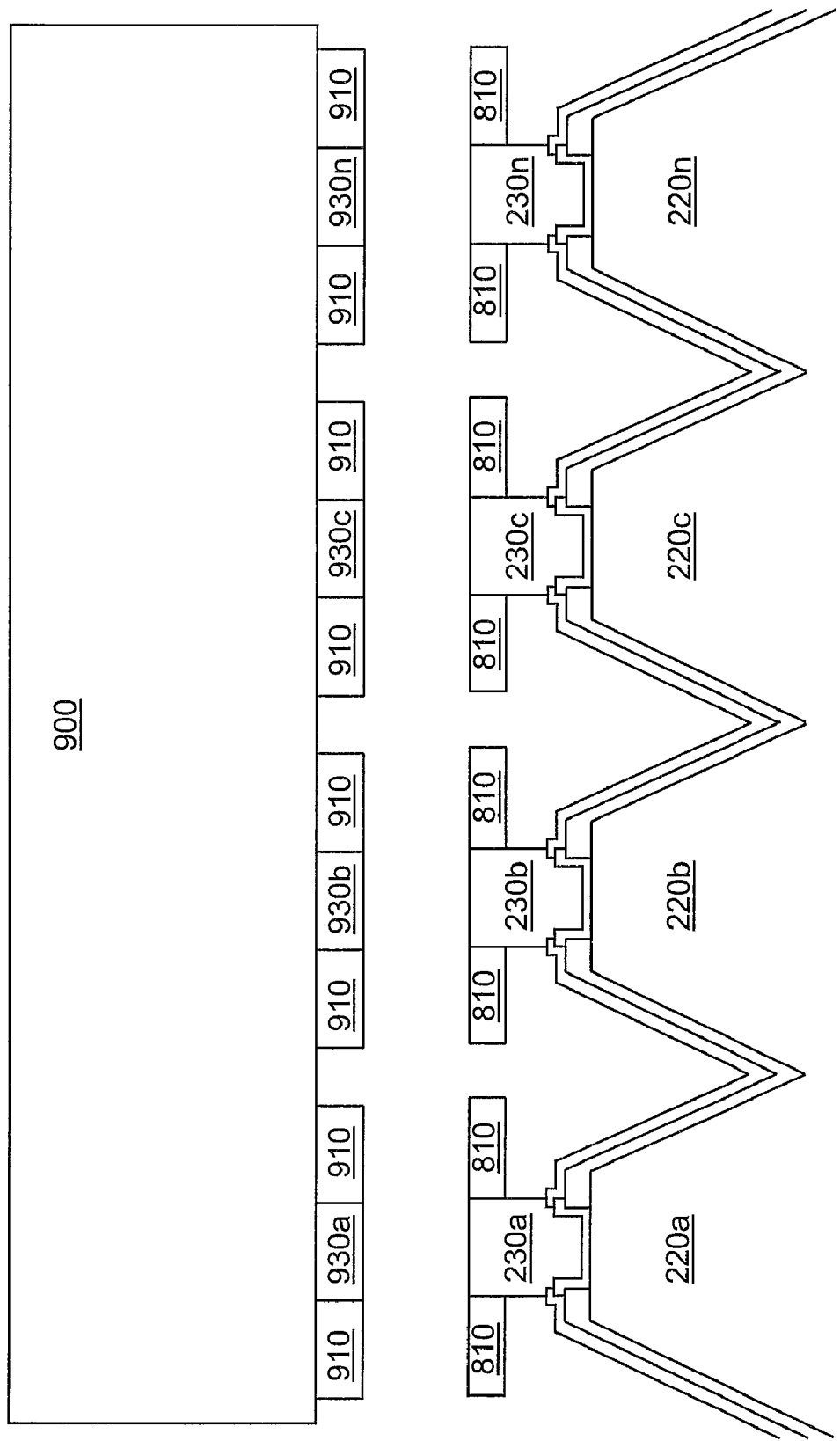
FIG. 9 is schematic depiction of the detector device and an integrated chip that are to be bonded, in accordance with an embodiment.

In one embodiment, floating oxide layer 810 may be utilized for oxide bonding of detector elements 220a, 220b, ..., 220n to an integrated chip, for example, a readout integrated chip. As shown in FIG. 9, readout integrated chip 900 is provided with a plurality of corresponding bumps 930a, 930b, ..., 930n and an oxide layer 910 in between the corresponding bumps 930a, 930b, ..., 930n. It will be appreciated that even though oxide layer 910 is shown surrounding the corresponding 930a, 930b, ..., 930n, the oxide layer may be formed on the entire surface between the bumps.

In one embodiment, optionally, corresponding bumps 930a, 930b, ..., 930n of readout integrated chip 900 may also have corresponding barrier layer (not shown) formed on each of the bumps 930a, 930b, ..., 930n, wherein the corresponding barrier layer comprises a corresponding diffusion barrier layer and metal contact layer.

Corresponding bumps 930a, 930b, ..., 930n of readout integrated chip 900 are aligned with bumps 230a, 230b, ..., 230n of detector elements 220a, 220b, ..., 220n. In one embodiment, the bumps 230a, 230b, ..., 230n of detector elements 220a, 220b, ..., 220n and corresponding bumps 930a, 930b, ..., 930n of readout integrated chip 900 may be aligned by a "pick-and-place" process.

Once in alignment, the bumps 230a, 230b, ..., 230n of detector elements 220a, 220b, ..., 220n and corresponding bumps 930a, 930b, ..., 930n of readout integrated chip 900 may be brought into contact with one another (as shown in FIG. 10, for example). When the bumps are brought into contact with one another, floating oxide layer 810 and oxide layer 910 may also be brought into contact with one another. An oxide-to-oxide bond starts forming between floating oxide layer 810 and oxide layer 910 essentially as soon as the layers are brought into contact. In one embodiment, the oxide-to-oxide bond may be a chemical bond, for example, a covalent bond. In one embodiment, upper surfaces of floating oxide layer 810 and oxide layer 910 may be activated prior to initiating the formation of the oxide-to-oxide bond. In one embodiment, the formation of the oxide-to-oxide bond between the floating oxide layer 810 and oxide layer 910 may be initiated by a temperature excursion to a temperature acceptable for the particular materials being used. In one embodiment, the formation of the oxide-to-oxide bond between the floating oxide layer 810 and oxide layer 910 may be initiated by applying a slight threshold pressure, which is significantly less than the amount of external pressure applied during an indium-to-indium cold welding process. One process of forming oxide-to-oxide bonds is described in more detail in U.S. Pat. Nos. 6,902,987 and 6,962,835, and U.S. Patent Application Publication No. 2004/0235266 assigned to Ziptronix, Inc, that are hereby incorporated by reference in their entirety. Consequently, the oxide-to-oxide bonding process will not be discussed in detail.

In one embodiment, the oxide-to-oxide bond formed between floating oxide layer 810 and oxide layer 910 may serve as a structural bond between detector elements 220a, 220b, ..., 220n, and readout integrated chip 900. The pressure generated by the bonding of the floating oxide layer 810 and oxide layer 910 causes the bumps 230a, 230b, ..., 230n of detector elements 220a, 220b, ..., 220n and corresponding bumps 930a, 930b, ..., 930n of readout integrated chip 900 to be intimately contacted with one another. In one embodiment, the pressure generated by the bonding of the floating oxide layer 810 and oxide layer 910 is enough to bring the bumps on detector elements 220a, 220b, ..., 220n and corresponding bumps 930a, 930b, ..., 930n on readout integrated chip 900 into intimate contact with each other without the need for application of external pressure (as is the case in conventional indium-to-indium cold welding). In one embodiment, the formation of the oxide-to-oxide bond removes essentially all mechanical stresses on and between the bumps on detector elements 220a, 220b, ..., 220n and corresponding bumps 930a, 930b, ..., 930n on readout integrated chip 900.

In one embodiment, a non-oxide bond may be formed between the intimately contacted bumps 230a, 230b, ..., 230n of detector elements 220a, 220b, ..., 220n and corresponding bumps 930a, 930b, ..., 930n of readout integrated chip 900. In one embodiment, the non-oxide bond provides an electrical connection between detector elements 220a, 220b, ..., 220n and readout integrated chip 900. In one embodiment, the non-oxide bond is a metallic bond formed between the bumps 230a, 230b, ..., 230n of detector elements 220a, 220b, ..., 220n and corresponding bumps 930a, 930b, ..., 930n of readout integrated chip 900. In one embodiment, the metallic bond between the bumps is formed by the fusion or diffusion of metal atoms (of the bumps).

In one embodiment, optionally, the non-oxide bond is a bond formed between the barrier layer 310 on bumps 230a, 230b, ..., 230n of detector elements 220a, 220b, ..., 220n and corresponding barrier layer on corresponding bumps 930a, 930b, ..., 930n of readout integrated chip 900. In one embodiment, optionally, the non-oxide bond is a metallic bond formed between metal contact layer 330 on bumps 230a, 230b, ..., 230n of detector elements 220a, 220b, ..., 220n and corresponding metal contact layer on corresponding bumps 930a, 930b, ..., 930n of readout integrated chip 900. In one embodiment, optionally, the non-oxide bond between the barrier layers/metal contact layers is formed by an annealing process, which may be carried out at a temperature of less than or equal to 170° C., for example.

As mentioned above, when a conventional indium-to-indium cold welding process is utilized to bond detector elements to a readout integrated chip, high external pressure/force needs to be applied. Conventionally, the indium-to-indium bond formed between the detector elements and the readout integrated chip serves as a structural bond as well as an electrical connection between the detector elements and the readout integrated chip. As can be appreciated, per various embodiments described herein, an oxide-to-oxide bond between floating oxide layer 810 and oxide layer 910 is formed without application of high external pressure, and serves as a structural bond between detector elements 220a, 220b, ..., 220n and the readout integrated chip 900. Because floating oxide layer 810 does not contact surfaces of detector elements 220a, 220b, ..., 220n or surfaces of wafer 210, no damage is caused to detector elements 220a, 220b, ..., 220n during the oxide-to-oxide bonding process, offering a substantial improvement over the conventional approach described above. Moreover, the non-oxide bond formed between the bumps 230a, 230b, ..., 230n of detector elements 220a, 220b, ..., 220n and corresponding bumps 930a, 930b, ..., 930n of readout integrated chip 900 (which serves as an electrical connection between detector elements 220a, 220b, ..., 220n and the readout integrated chip 900), may also be formed without application of high pressure/force. Undesirable reduction in the production yield may also be avoided due to the breakage of indium bumps resulting from the high pressures/forces required to be applied during the conventional bonding process, e.g., indium-to-indium cold welding.

Referring back to FIG. 10, a microelectronic device 1000 may be fabricated by the bonding of detector elements 220a, 220b, ..., 220n to readout integrated chip 900. Microelectronic device 1000 may have an interconnect interface 1010 between bumps 230a, 230b, ..., 230n of detector elements 220a, 220b, ..., 220n and corresponding bumps 930a, 930b, ..., 930n of readout integrated chip 900. The interconnect interface 1010 may include the oxide-to-oxide bond formed between floating oxide layer 810 and oxide layer 910, and the non-oxide bond formed between bumps 230a, 230b, ..., 230n of detector elements 220a, 220b, ..., 220n and corresponding bumps 930a, 930b, ..., 930n of readout integrated chip 900.

Other embodiments, uses and advantages of the inventive concept will be apparent to those skilled in the art from consideration of the above disclosure and the following claims. The specification should be considered non-limiting and exemplary only, and the scope of the inventive concept is accordingly intended to be limited only by the scope of the following claims.

What is claimed is:

1. A method of preparing detectors for oxide bonding, the method comprising:
   providing a wafer having a plurality of detector elements with bumps thereon;
   forming a layer of polymer between each of the bumps;
   depositing an oxide layer on a top portion of each of the bumps and the polymer layer;
   forming a plurality of vias in the oxide layer between adjacent bumps;
   removing the polymer layer such that a remaining oxide layer forms a floating oxide layer, the floating oxide layer surrounding each of the bumps at the top portion thereof.

2. The method of claim 1, further comprising forming a barrier layer on each of the bumps prior to forming the layer of polymer between each of the bumps.

3. The method of claim 2, wherein the barrier layer comprises a plurality of layers.

4. The method of claim 2, wherein the barrier layer comprises a metal nitride layer.

5. The method of claim 2, wherein the barrier layer comprises a first layer that serves as a diffusion barrier between the bumps and a second layer formed on top of the first layer.

6. The method of claim 1, wherein forming a layer of polymer between each of the bumps comprises:
   forming a first polymer layer on and in between each of the bumps;
   thinning down at least a portion of the first polymer layer such that a top portion of each of the bumps is exposed and a second polymer layer is formed between each of the bumps.

7. The method of claim 1, wherein the polymer layer comprises a soluble polymer layer.

8. The method of claim 6, wherein the thinning down is performed by a process using one or more of deionized water and isopropyl alcohol.

9. The method of claim 1, wherein the depositing the oxide layer comprises depositing the oxide layer by either sputtering or chemical vapor deposition.

10. The method of claim 1, wherein the depositing of the oxide layer is performed at a temperature less than a melting point of the polymer layer.

11. The method of claim 1, wherein forming a plurality of vias in the oxide layer between adjacent bumps comprises:
    applying a photoresist layer on the oxide layer;
    patterning the photoresist layer for formation of the plurality of vias between the adjacent bumps;
    etching the oxide layer to form the plurality of vias in the oxide layer between the adjacent bumps; and
    removing the photoresist layer to expose the plurality of vias.

12. The method of claim 1, wherein removing the polymer layer comprises removing the polymer layer by performing a de-ionizing rinse.

13. The method of claim 1, further comprising providing an integrated chip with a plurality of corresponding bumps thereon and an oxide layer adjacent to and between the bumps.

14. The method of claim 13, further comprising aligning corresponding bumps on the integrated chip with the bumps on the detector elements.

15. The method of claim 14, wherein the aligning is performed by utilizing a pick and place process.

16. The method of claim 13, further comprising:
    contacting the corresponding bumps on the integrated chip with the bumps on the detector elements; and
    forming an oxide-to-oxide bond between the floating oxide layer and the oxide layer of the integrated chip,
    wherein the oxide-to-oxide bond between the floating oxide layer and the oxide layer of the integrated chip provides a structural bond between the detector elements and the integrated chip.

17. The method of claim 16, wherein said forming an oxide-to-oxide bond:
    (a) brings the bumps on the integrated chip and the bumps on the detector elements into intimate contact with each other, and
    (b) removes essentially all mechanical stresses on and between the bumps on the integrated chip and the bumps on the detector elements.

18. The method of claim 17, further comprising forming a non-oxide bond between the intimately contacted bumps on the integrated chip and bumps on the detector elements, wherein the non-oxide bond provides an electrical connection between the bumps on detector elements and the bumps on the integrated chip.

19. The method of claim 18, wherein forming a non-oxide bond comprises forming a metallic bond between the bumps on the integrated chip and the bumps on the detector elements.

20. The method of claim 18, wherein forming a non-oxide bond comprises forming a bond between a barrier layer on the bumps of the integrated chip and a barrier layer on the bumps of the detector elements.

21. The method of claim 1, further comprising planarizing the oxide layer such that a top surface thereof is aligned with a top surface of each of the bumps prior to the forming of the plurality of vias.

22. The method of claim 13, wherein the corresponding bumps on the integrated chip and the bumps on the detector elements comprise indium bumps.

23. A microelectronic device comprising:
    a detector array having a plurality of detector elements with bumps thereon, each of the bumps having a floating oxide layer surrounding the bumps at a top portion thereof;
    an integrated chip having corresponding bumps thereon and an oxide layer in between the bumps; and
    an interconnect interface between the corresponding bumps on the integrated chip and the bumps on the detector elements, the interconnect interface comprising:
        an oxide-to-oxide bond between the floating oxide layer and the oxide layer of the integrated chip, the oxide-to-oxide bond providing a structural bond between the detector elements and the integrated chip and removing essentially all mechanical stresses on and between the bumps on the integrated chip and the bumps on the detector elements; and
        an electrical connection between each of the corresponding bumps on the integrated chip and the bumps on the detector elements.

24. The device of claim 23, further comprising at least one barrier layer between the bumps on the detector elements and the corresponding bumps on the integrated chip.

25. The device of claim 23, wherein the electrical connection comprises a non-oxide bond.

26. The device of claim 23, wherein said integrated chip comprises a readout integrated chip.

* * * * *